United States Patent
Bergmann

(10) Patent No.: US 9,664,743 B2
(45) Date of Patent: May 30, 2017

(54) BATTERY CELL MONITORING UNIT, METHOD FOR FAULT DETECTION AND ELIMINATION THEREIN, BATTERY SYSTEM AND MOTOR VEHICLE

(71) Applicants: Robert Bosch GmbH, Stuttgart (DE); Samsung SDI Co., Ltd., Yongin-si, Gyeonggi-do (KR)

(72) Inventor: Sven Bergmann, Stuttgart (DE)

(73) Assignees: Robert Bosch GmbH, Stuttgart (DE); Samsung SDI Co., Ltd., Yongin-si, Gyeonggi-do (KR)

( * ) Notice: Subject to any disclaimer, the term of this patent is extended or adjusted under 35 U.S.C. 154(b) by 821 days.

(21) Appl. No.: 13/906,925

(22) Filed: May 31, 2013

(65) Prior Publication Data

US 2013/0323553 A1 Dec. 5, 2013

(30) Foreign Application Priority Data

Jun. 1, 2012 (DE) .................. 10 2012 209 273

(51) Int. Cl.
*G01N 27/416* (2006.01)
*G01R 31/36* (2006.01)
*H01M 10/48* (2006.01)
*G01R 19/25* (2006.01)
*H01M 10/052* (2010.01)

(52) U.S. Cl.
CPC .......... *G01R 31/362* (2013.01); *H01M 10/48* (2013.01); *H01M 10/482* (2013.01); *H01M 10/486* (2013.01); *G01R 19/2506* (2013.01); *H01M 10/052* (2013.01); *H01M 2220/20* (2013.01); *Y02E 60/122* (2013.01)

(58) Field of Classification Search
CPC .................................................... G01R 31/362
USPC ................................................ 324/433, 434
See application file for complete search history.

(56) References Cited

U.S. PATENT DOCUMENTS

| | | | | |
|---|---|---|---|---|
| 6,268,710 B1 * | 7/2001 | Koga | ................. | G01R 31/3624 320/116 |
| 8,396,680 B2 * | 3/2013 | Katrak | ............... | G01R 19/2509 324/522 |
| 8,754,963 B2 * | 6/2014 | Lim | ......................... | G06T 5/50 348/240.99 |
| 8,907,626 B2 * | 12/2014 | Tanigawa | ............ | B60L 11/1851 320/116 |

* cited by examiner

*Primary Examiner* — Richard V Muralidar
(74) *Attorney, Agent, or Firm* — Maginot, Moore & Beck LLP

(57) ABSTRACT

A battery cell monitoring unit for monitoring battery cells includes at least one reference input for a reference voltage and at least one measurement input for a measurement voltage. The battery cell monitoring unit is configured to compare the reference voltage with at least one expected reference voltage value and to compare the measurement voltage with an expected measurement voltage range.

6 Claims, 4 Drawing Sheets

BATTERY CELL MONITORING UNIT, METHOD FOR FAULT DETECTION AND ELIMINATION THEREIN, BATTERY SYSTEM AND MOTOR VEHICLE

This application claims priority under 35 U.S.C. §119 to patent application no. DE 10 2012 209 273.0, filed on Jun. 1, 2012 in Germany, the disclosure of which is incorporated herein by reference in its entirety.

BACKGROUND

The present disclosure relates to a battery cell monitoring unit for monitoring battery cells and to a method for fault detection and elimination in a battery cell monitoring unit. Furthermore, the disclosure relates to a battery system comprising a battery cell monitoring unit and to a motor vehicle comprising the battery system.

In electrically driven vehicles, lithium-based accumulators or batteries are frequently used since these have a high energy density. In this arrangement, a battery pack is constructed of a number of battery modules which themselves, in turn, consist of the individual lithium battery cells. Due to their operation and the materials used, lithium accumulators require careful control and monitoring both during charging and during discharging. This task is usually handled by a battery management unit. Known battery management units consist of a battery control unit and a battery cell monitoring unit per battery module. Conventional battery cell monitoring units contain an integrated measuring chip, temperature sensors and resistors for balancing the battery cells. Such measuring chips, e.g. the TI bq76PL536 chip, measure voltages of a number of battery cells and their temperature and have for this purpose an analog/digital converter and a multiplexer which switches the various battery cell voltages, voltages from temperature sensors and a reference voltage through to the analog/digital converter. Such an analog/digital converter generates a sequence of measurement data which reproduce the battery cell voltages and temperatures.

SUMMARY

According to the disclosure, a battery cell monitoring unit for monitoring battery cells comprising at least one reference input for a reference voltage and at least one measurement input for a measurement voltage is provided. The battery cell monitoring unit includes a comparing unit configured to compare the reference voltage with at least one expected reference voltage value. In addition, the comparing unit compares the measurement voltage with an expected measurement voltage range.

The method according to the disclosure for fault detection and elimination in a battery cell monitoring unit comprising at least one reference input for a reference voltage and at least one measurement input for a measurement voltage has at least the following steps: (i) comparing the reference voltage with at least one expected reference voltage value, and (ii) comparing the measurement voltage with an expected measurement voltage range.

Furthermore, a battery system comprising at least one battery cell, a battery management unit and the battery cell monitoring unit according to the disclosure for monitoring the at least one battery cell is provided.

In addition, the disclosure provides a motor vehicle comprising the battery system, the battery system being connected to a propulsion system of the motor vehicle.

The battery cell monitoring unit according to the disclosure can advantageously detect faulty measurements and eliminate faulty measurements. The battery cell monitoring unit substantially continuously detects a number of measurement voltages and reference voltages following one another. If the battery cell monitoring unit wrongly skips a measurement voltage or a reference voltage during this process or measures or detects it twice, it is possible to determine by means of the comparison with the values of reference voltage value and measurement voltage range expected in each case whether a measurement voltage or a reference voltage has been skipped or measured or detected twice.

In particular, the battery cell monitoring unit can compare the reference voltage with at least two expected reference voltage values. If the reference voltage varies, for example, periodically between two reference voltage values, the battery cell unit can perform comparisons with the two expected reference voltage values. A comparison can have a positive result if a reference voltage value corresponds to one of the two expected reference voltage values. If the reference voltage value at the reference input does not correspond to either of the two expected reference voltage values, the comparison can yield a negative result. By this means, the battery cell monitoring unit can find a faulty measurement and discard it.

The battery cell monitoring unit preferably comprises an analog/digital converter for converting the reference voltage and the measurement voltage into digital data. It is also preferred that the battery cell monitoring unit comprises a plurality of measurement inputs and a multiplexer. The multiplexer can connect the plurality of measurement inputs and the at least one reference input cyclically to the analog/digital converter. By means of this embodiment, the battery cell monitoring unit can monitor, for example, a plurality of battery cells or sensors in parallel, wherein measurement voltages can be converted into a serial sequence of measurement data by means of the multiplexer and the analog/digital converter.

Such a serial sequence of measurement data substantially comprises digitized measurement voltages and reference voltages in a particular order. If a faulty measurement occurs in the battery cell monitoring unit, for instance because a measurement voltage or a reference voltage has been detected twice or skipped, such a faulty measurement can be found and, for example, discarded and/or repeated by comparisons of one of the reference voltages and one of the measurement voltages with in each case an expected reference voltage value and an expected measurement voltage range.

In particular, the method for fault detection can distinguish between two or more measurement voltages on the basis of two or more different measurement voltage ranges expected in each case. In other words, a first measurement voltage is typically expected by the battery cell monitoring unit in a first measurement voltage range, a second measurement voltage is expected by the battery cell monitoring unit in a second measurement voltage range, etc. The first measurement voltage range can differ from the second measurement voltage range in such a manner that the battery cell monitoring unit can detect a pattern of successive measurement voltages or faulty measurements.

In a further preferred embodiment, the battery cell monitoring unit comprises especially an analog/digital converter having at least one of the errors of offset error, gain error and linearity error. The method for fault detection and elimination can correct or eliminate the at least one fault by means of at least three expected reference voltage values.

In the case of an ideal analog/digital converter, there is generally a linear relationship between input and output variable. Apart from quantization errors, the offset error, also called zero point error, can occur, among others. A digital value for an analog/digital converter input voltage, e.g. a measurement voltage, differs by a constant amount from the actual value in the case of the offset error. The offset error can be eliminated or corrected, in particular, by applying a reference voltage to the reference input and comparing it with an expected reference voltage. Applying a reference voltage to a measurement input can generally rearrange a measurement input into a reference input in this context.

The gain error, also called sensitivity error or slope error, is essentially a twisted analog/digital converter characteristic. A digital value for an analog/digital converter input voltage, e.g. a measurement voltage, differs by a constant percentage from the actual value in the case of the gain error. The gain error can be eliminated, in particular, by applying two reference voltages to the reference inputs and by comparing these with two expected reference voltages. The two reference voltages can be applied, e.g., offset in time, to one and the same reference input in this context. As an alternative, two reference voltages can be applied to two reference inputs.

The linearity error causes a nonlinear dependence between a digital value and the corresponding analog/digital converter input voltage. In this context, the linearity error corresponds to a curved analog/digital converter characteristic. It can be eliminated, in particular, by applying at least three reference voltages and by comparing these with at least three expected reference voltages. The three reference voltages can be applied offset in time to one or two reference inputs in this context. As an alternative, three reference voltages can be applied to three reference inputs. In a further alternative embodiment, one reference voltage can be applied to one reference input whilst two further reference voltages are applied offset in time to a second reference input.

The battery system preferably comprises a temperature sensor for measuring the temperature of the at least one battery cell. In this context, the temperature sensor can be connected to the at least one measurement input and can supply the measurement voltage. The temperature sensor can be constructed as an NTC resistor, also called a thermistor.

As well, a battery cell voltage of the at least one battery cell can be present at at least one measurement input, the battery cell voltage forming the measurement voltage.

It is also preferred that the battery system is a lithium-ion battery system.

BRIEF DESCRIPTION OF THE DRAWINGS

Exemplary embodiments of the disclosure will be explained in greater detail with reference to the drawings and the description following. In the drawings.

DETAILED DESCRIPTION

Figure 1:
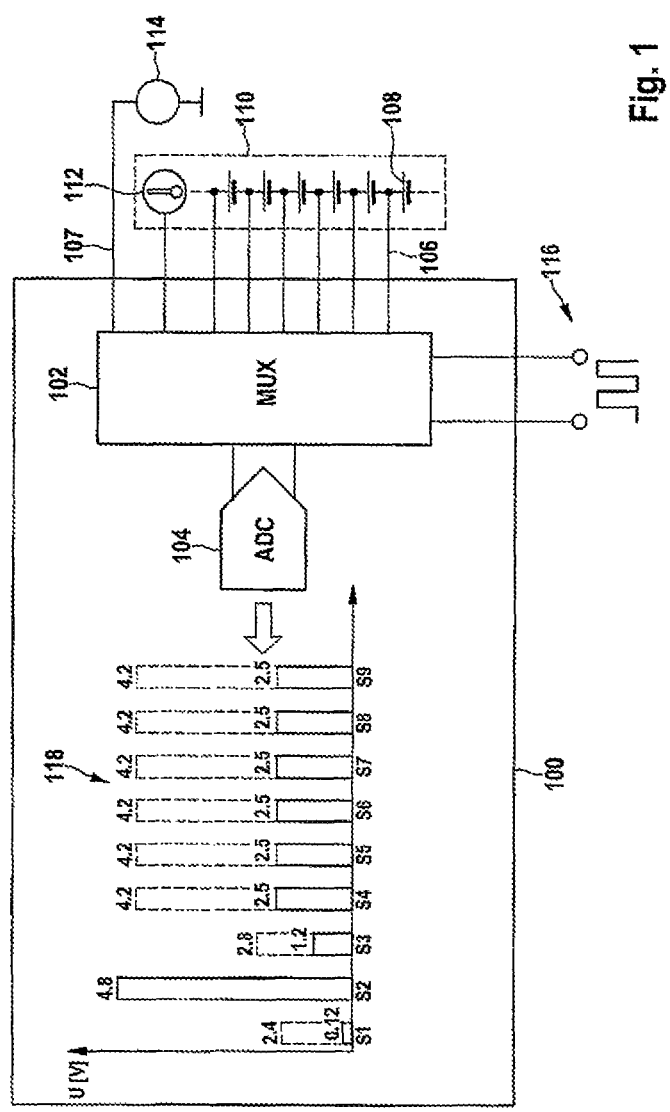
FIG. 1 shows an exemplary embodiment of a battery cell monitoring unit according to the disclosure.

FIG. 1 shows an exemplary embodiment of a battery cell monitoring unit 100 according to the disclosure, also called cell supervision circuit, or CSC. The battery cell monitoring unit 100 comprises a multiplexer 102 and an analog/digital converter 104. The multiplexer 102 has in the present example eight asymmetric measurement inputs 106. At six of the eight measurement inputs 106, battery cell voltages of six lithium-ion battery cells 108 are present. The six lithium-ion battery cells 108 form one battery module 110. The temperature of the battery module 110 is detected by a temperature sensor 112 which supplies a measurement voltage proportional to the battery module temperature and applies this to the seventh of the eight measurement inputs 106. At the eighth measurement input, a reference voltage source 114 is connected, this measurement input, as a result, being rearranged to form a reference input 107. In addition, the multiplexer 102 has a differential reference input 116 which forms a further reference input.

As an alternative, the multiplexer 102 can also have more or fewer than eight measurement inputs 106, e.g. four, sixteen or thirty two measurement inputs 106, in order to be able to measure, for example, differently designed battery modules 110 which have more or fewer than six lithium-ion battery cells 108.

The measurement inputs 106 can be designed differentially, instead of asymmetrically. Instead of the individual differential reference input 116, a plurality of differential reference inputs or further asymmetric reference inputs 107 can be provided.

The multiplexer 107 generates serial voltage values having a particular repetition rate from measurement voltages at the measurement inputs 106 and from reference voltages at the reference inputs 107, 116. The analog/digital converter 104 digitizes these serial voltage values to form a sequence of samples or to form a sequence of measurement data 118, respectively. If the battery cell monitoring unit 100 is operated continuously, a number of sequences of measurement data are produced following one another. The repetition rate of the sequences of measurement data is, for example, 24 kHz, that is to say a new sequence of measurement data is delivered every 42 µs. In this context, the operation of the battery cell monitoring unit 100 is described in greater detail with reference to FIGS. 2 to 6 as follows.

Figure 2:
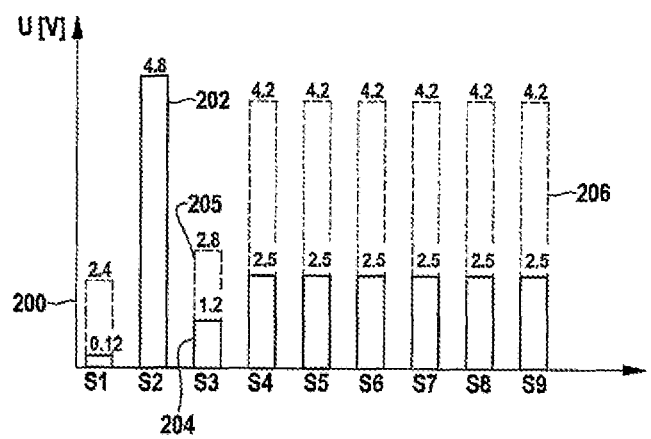
FIG. 2 shows a diagram with expected reference voltage values and expected measurement voltage ranges.

FIG. 2 shows a diagram with nine samples S1 to S9. The samples correspond to the digitized voltage values at the measurement inputs 106 and the reference inputs 107, 116 and are represented in the unit of volts along the vertical axis of the diagram. Sample S1 corresponds, e.g., to the voltage of the temperature sensor 112. This voltage is typically, e.g., between 0.12 V and 2.4 V. The battery cell monitoring unit 100 thus expects the sample S1 within a measurement voltage range 200 of approx. 0.12 V and approx. 2.4 V.

Sample S2 corresponds, e.g., to the voltage of the reference voltage source 114 which delivers a reference voltage of, e.g., 4.5 V. The battery cell monitoring unit 100 thus expects sample S2 at a reference voltage value 202 of approx. 4.5 V.

Sample S3 corresponds, e.g., to the voltage at the differential reference input 116. The voltage at the differential reference input is, for example, a rectangular voltage of alternately 1.2 V and 2.8 V. The battery cell monitoring unit 100 thus expects sample S3 at a reference voltage value 204 of approx. 1.2 V or at reference voltage value 205 of approx. 2.8 V.

Samples S4 to S9 correspond, e.g., to the voltages of the lithium-ion battery cells 108. A lithium-ion battery cell 108 has typically a voltage of between approx. 2.5 V and 4.2 V. The battery cell monitoring unit 100 thus expects samples S4 to S9 in each case within a measurement voltage range 206 of between approx. 2.5 V and approx. 4.2 V.

Figure 3:
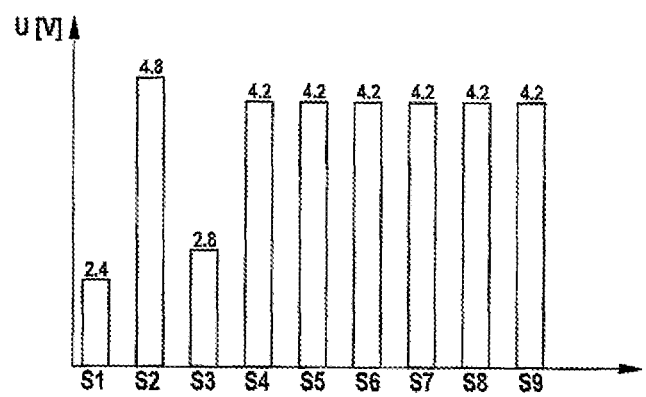
FIG. 3 shows a diagram with a sequence of measurement data.

FIG. 3 shows a diagram with a sequence of measurement data S1 to S9. The battery cell monitoring unit 100 initially compares sample S1, which has a voltage of 2.4 V, with the expected measurement voltage range 200 of approx. 0.12 V to approx. 2.4 V. Sample S1 is within the measurement voltage range 200, the comparison being positive.

After that, the battery cell monitoring unit 100 compares sample S2 which has a voltage of 4.8 V with the expected reference voltage value of approx. 4.8 V, the comparison being positive.

After that, the battery cell monitoring unit 100 compares sample S3 which has a voltage of 2.8 V with the two expected reference voltage values 204, 205 at approx. 1.2 V and approx. 2.8 V, the comparison being positive.

Subsequently, the battery cell monitoring unit 100 compares samples S4 to S9 which have in each case a voltage of 4.2 V with the expected measurement voltage ranges 206 of approx. 2.5 V to approx. 4.2 V, the comparisons being positive.

The battery cell monitoring unit 100 detects the sequence of measurement data shown in FIG. 3 as being correct and can process the information contained therein, such as battery module temperature and lithium-ion battery cell voltages, further, e.g., in a battery management unit.

Figure 4:
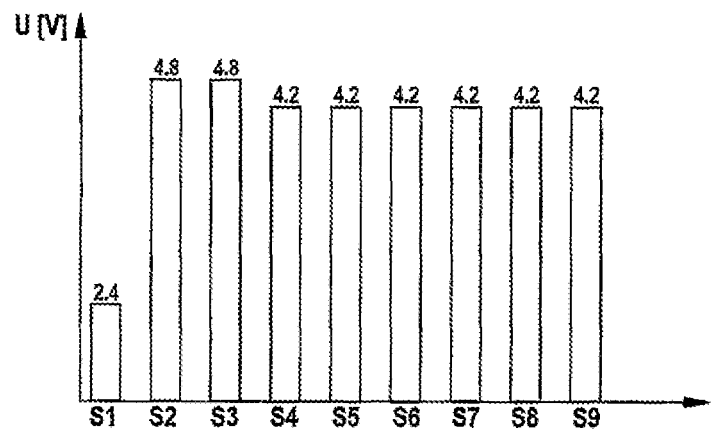
FIG. 4 shows a further diagram with a sequence of measurement data.

FIG. 4 shows a further diagram with a sequence of measurement data. In a comparison of sample S3, which has a voltage of 4.8 V, with the two expected reference voltage values 204, 205 at approx. 1.2 V and approx. 2.8 V, the battery cell monitoring unit 100 finds a serious deviation, that is to say a faulty measurement. A serious deviation is, for example, a deviation of more than 10%, 20% or 50% from the expected value. The multiplexer 102 wrongly switches the reference voltage 4.5 V of the reference voltage source 114 through twice to the analog/digital converter and thus caused this fault. Since a faulty measurement was detected in the multiplexer 102, the battery cell monitoring unit 100 discards the sequence of measurement data shown in FIG. 4 and does not process these further.

Figure 5:
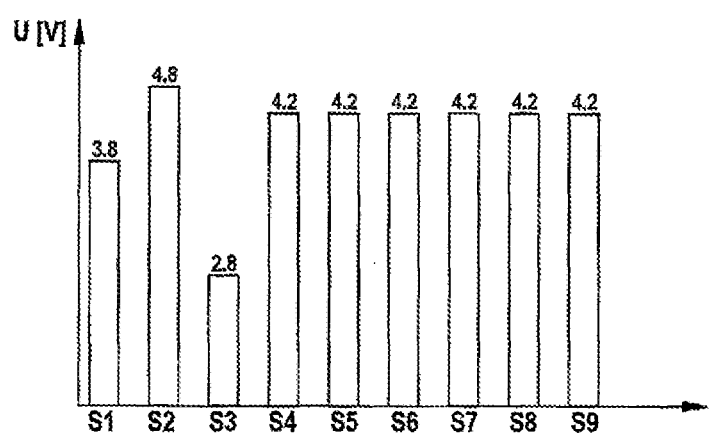
FIG. 5 shows a further diagram with a sequence of measurement data.

FIG. 5 shows a further diagram with a sequence of measurement data. In a comparison of sample S1, which has a voltage of 3.8 V, with the expected measurement voltage range 200 of approx. 0.12 V to approx. 2.4 V, the battery cell monitoring unit 100 finds a serious deviation, that is to say a faulty measurement. The multiplexer 102 has, e.g., switched a battery cell voltage of a preceding sequence of measurement data through twice to the analog/digital converter and has thus skipped the voltage of the temperature sensor. The sequence of measurement data is discarded.

Figure 6:
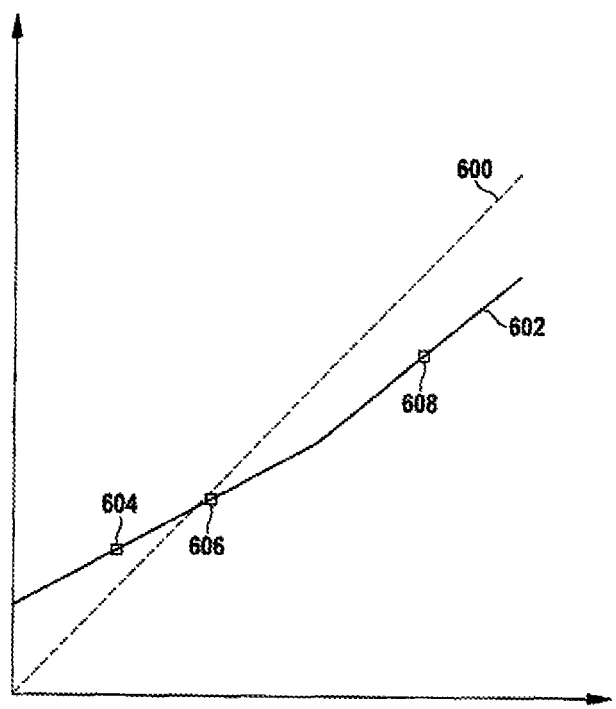
FIG. 6 shows a diagram with characteristics of an analog/digital converter.

FIG. 6 shows a diagram with an ideal characteristic 600 of the analog/digital converter 104. Along the horizontal axis of the diagram, input voltages are shown and, along the vertical axis, digitized output voltages of the analog/digital converter 104 are shown. Since the analog/digital converter 104 ages and is exposed to various temperatures, an actual characteristic 602 is present which has, among others, an offset error, a gain error and a linearity error. As a result, measured reference voltages 604, 606, 608 deviates slightly from the expected reference voltage values 202, 204, 205. A slight deviation is, for example, about 0.1% to 2% or up to 5% of the reference voltage value 202, 204, 205 expected in each case. A correction of the characteristic can be determined by means of a method of least error squares. The expected reference voltage values 202, 204, 205 are, therefore, used for the calibration of the analog/digital converter 104 and thus for fault elimination in the battery cell monitoring unit 100.

On the one hand, the combination of expected reference voltage values 202, 204 and expected measurement voltage ranges 200, 206 enables faulty measurements caused by the multiplexer 102, e.g. double measurement or skipped measurement values, to be detected and discarded and, on the other hand, systematic faulty measurements due to an offset error, gain error and linearity error in the analog/digital converter 104 to be eliminated.

The battery cell monitoring unit 100 can be used, for example, in a battery system for motor vehicles and can ensure improved safety and reliability of the motor vehicle.

What is claimed is:

1. A battery cell monitoring unit for detecting a fault in a measurement device connected to a plurality of battery cells, comprising:
    a multiplexer including a first plurality of inputs and an output, each input being connected to one battery cell in the plurality of battery cells, the multiplexer being configured to repeatedly connect each input in the plurality of inputs to the output in a predetermined sequence at a predetermined frequency to generate a plurality of output voltage signals in the predetermined sequence;
    and
    a comparing unit connected to the output of the multiplexer, the comparing unit being configured to:
        receive a first voltage level signal corresponding to an output signal from the output of the multiplexer for a voltage level of one battery cell in the plurality of battery cells during the predetermined sequence; and
        detect a fault in the multiplexer in response to the first voltage level signal being outside of a predetermined measurement voltage range.

2. The battery cell monitoring unit according to claim 1 the comparing unit being further configured to:
    detect a fault in the multiplexer indicating that the multiplexer skipped a connection of one input in the plurality of inputs connected to the one battery cell to the output of the multiplexer in response to the first voltage level signal being below the predetermined voltage measurement range.

3. The battery cell monitoring unit according to claim 1, the comparing unit being further configured to:
    detect a fault in the multiplexer indicating that the multiplexer connected one input in the plurality of inputs connected to the one battery cell to the output of the multiplexer for longer than one period of the predetermined frequency in response to the first voltage level signal being above the predetermined voltage measurement range.

4. The battery cell monitoring unit according to claim 1 further comprising:
    an additional input of the multiplexer being connected to a reference voltage source, the multiplexer being configured to connect the additional input to the output in the predetermined sequence at the predetermined frequency; and the comparing unit being further configured to:
- receive a second voltage level signal corresponding to an output signal from the output of the multiplexer for a voltage level of the reference voltage source during the predetermined sequence; and
- detect a fault in the multiplexer in response to the second voltage level signal deviating from a predetermined reference voltage level for the reference voltage source.

5. A battery system comprising:
- a plurality of battery cells;
- a multiplexer including a first plurality of inputs and an output, each input being connected to one battery cell in the plurality of battery cells, the multiplexer being configured to repeatedly connect each input in the plurality of inputs to the output in a predetermined sequence at a predetermined frequency to generate a plurality of output voltage signals in the predetermined sequence; and
- a comparing unit connected to the output of the multiplexer, the comparing unit being configured to:
  - receive a first voltage level signal corresponding to an output signal from the output of the multiplexer for a voltage level of one battery cell in the plurality of battery cells during the predetermined sequence; and
  - detect a fault in the multiplexer in response to the first voltage level signal being outside of a predetermined measurement voltage range.

6. The battery system of claim 5, the comparing unit being further configured to:
- detect a fault in the multiplexer indicating that the multiplexer skipped a connection of one input in the plurality of inputs connected to the one battery cell to the output of the multiplexer in response to the first voltage level signal being below the predetermined voltage measurement range.

* * * * *